United States Patent [19]
Gist

[11] Patent Number: 5,986,868
[45] Date of Patent: Nov. 16, 1999

[54] INPUT AND OUTPUT NOISE REDUCTION CIRCUIT

[75] Inventor: William B. Gist, Chelmsford, Mass.

[73] Assignee: Digital Equipment Corporation, Houston, Tex.

[21] Appl. No.: 09/206,019

[22] Filed: Dec. 4, 1998

Related U.S. Application Data

[63] Continuation of application No. 08/833,014, Mar. 27, 1997, Pat. No. 5,877,930.

[51] Int. Cl.$^6$ ...................................................... H02H 3/22
[52] U.S. Cl. .............................. 361/111; 361/56; 361/118; 361/119
[58] Field of Search .............................. 361/111, 56, 127, 361/18, 58, 113, 117, 118, 119

[56] References Cited

U.S. PATENT DOCUMENTS

| | | | |
|---|---|---|---|
| 5,511,171 | 4/1996 | Bowman | 361/58 |
| 5,841,271 | 11/1998 | Nagayama | 323/316 |
| 5,877,930 | 3/1999 | Gist | 361/111 |

*Primary Examiner*—Stephen W Jackson
*Attorney, Agent, or Firm*—Hamilton, Brook, Smith & Reynolds, PC

[57] ABSTRACT

A circuit for limiting voltage transient excursions on a power supply node is disclosed. The circuit includes a first field effect transistor dispose to provide a capacitance and having source and drain electrodes coupled to said external supply node path and having a gate electrode and first and second clamp transistors. A resistance is coupled between the gate electrode of said first transistor and the internal supply return node and to gate electrodes of the clamp transistors. The circuit also include process resistances between internal and external supply connection to provide a charge transfer path between external and internal supply nodes and external and internal return nodes.

6 Claims, 4 Drawing Sheets

INPUT AND OUTPUT NOISE REDUCTION CIRCUIT

This application is a continuation of application Ser. No. 08/833,014 filed on Mar. 27, 1997 now U.S. Pat. No. 5,877,930, the entire teachings of which are incorporated herein by reference.

BACKGROUND OF THE INVENTION

This invention relates generally to integrated circuits and more particularly to circuits used to reduce input and or output switching noise.

As is known in the art, an integrated circuit is comprised of a plurality of active and passive devices arranged to provide a circuit function on a common supporting semiconductive substrate. One type of integrated circuit is a so-called digital integrated circuit which is comprised of transistors used to form logic gates and logic functions for computer systems and other similar types of systems. A particular type of digital integrated circuit called an ASIC (application specific integrated circuit) generally has standardized circuits which can be customized to provide a particular digital function.

In general, with ASICs as well as other types of integrated circuits, there are signal and power connections made to the circuit. That is, DC power is delivered to the circuit to control transistors and other devices which process signals that are sent along signal lines. One problem associated with digital integrated circuits is that very dense integrated circuits, that is, those comprised of a large number of transistor devices and having associated a large number of signal pins, may produce transient voltages that affect power supply voltages delivered to logic circuits.

Generally ASICs are used to interface other logic devices to a system bus. The ASIC can include various system functional circuits such as, for example, a network bridge chip to interconnect two different buses such as a system bus and a network bus as well as other arrangements. One such circuits is a bus interface circuit. The bus interface circuits generally comprise two types of circuits, receivers and drivers. Drivers are circuits which, in response to an input logic signal, provide an output logic signal onto a signal bus. Drivers require a relatively large amount of current in order to drive all of the modules which may be connected to the system bus. Receivers, on the other hand, generally require less current. They are used to sense the signal from the system bus and provide as an output a received signal having a particular logic state. This signal is then used by the internal logic circuits on the ASIC. With drivers and receivers, the circuits are coupled to the power supply connections made to the ASIC. As the signals are fed from or to these circuits, the switching action of the signals changing state causes the drivers or receivers to draw current for a short period of time from the power supply.

The commencement of drawing current from the power supply through an inductive connection may cause a transient drop in the magnitude of the power supply voltage until the current reaches a steady state condition. Conversely, discontinuance of drawing of current through an inductive connection will cause a transient boost in the magnitude of the power supply voltage until the current reaches a steady state condition. A capacitance is generally included between the power supply connection and the reference connection in order to minimize this transient voltage variation at that location.

Nevertheless, these transients in the on-chip power supply provide a certain power source noise characteristic which is undesirable for operation of the bus drivers and receivers as well as the digital logic circuits contained within the ASIC. In order to solve this problem one approach is to provide a large number of power pins for a given number of signal pins. On the ASIC there is a corresponding number of power pins, that is, supply voltage and return for a given number of signal pins. While this is satisfactory in some respects to reduce noise, one problem associated with this approach is that it minimizes the number of signal pins that can exist for a given size ASIC package.

A second problem with power connections on ASICs is that mutual inductance of magnetically coupled devices and package parasitic inductances can produce transients causing data transitions commonly referred to as "input noise" or "output noise" when adjacent input and/or output or power supply pins of the package have switching voltages thereon. That is, the mutual inductance associated between a given pin on the package and its magnetically coupled neighbors can induce a current into the pin which can cause a transition error, that is, it can cause a spike which may be misunderstood as a logical transition. A third problem with power supply connection on ASICs is that voltage transients can reduce ASIC component reliability and lifetime through voltage over-stress induced failure.

In the prior art, such input noise problems and reliability problems were addressed by providing a large number of package pins dedicated to power as described above as well as through judicious selection of pin sequence, layout and output selection.

SUMMARY OF THE INVENTION

In accordance with the present invention, a power distribution arrangement for an integrated circuit includes a first plurality of external supply lines, a first portion of said external supply lines corresponding to external supply voltage paths and a second portion of external supply voltage return paths and a second plurality of resistors corresponding in number to said portion of said first plurality disposed to couple each of said external supply paths to a corresponding isolated internal supply path to provide power to the integrated circuit. With such an arrangement, the process resistance provides a path between the internal power supply lines and the external power supply lines. This path permits transfer of stored charge to the external lines from the effective capacitance between the internal lines in the integrated circuit. This provides a damping resistance to the effective resonant circuits provided from inherent inductances associated with package power supply connections.

BRIEF DESCRIPTION OF THE DRAWINGS

The above-mentioned and other features of the invention will now become more apparent by referring to the accompanying description taken in conjunction with the accompanying drawings, in which.

DESCRIPTION OF THE PREFERRED EMBODIMENTS

Figure 1:
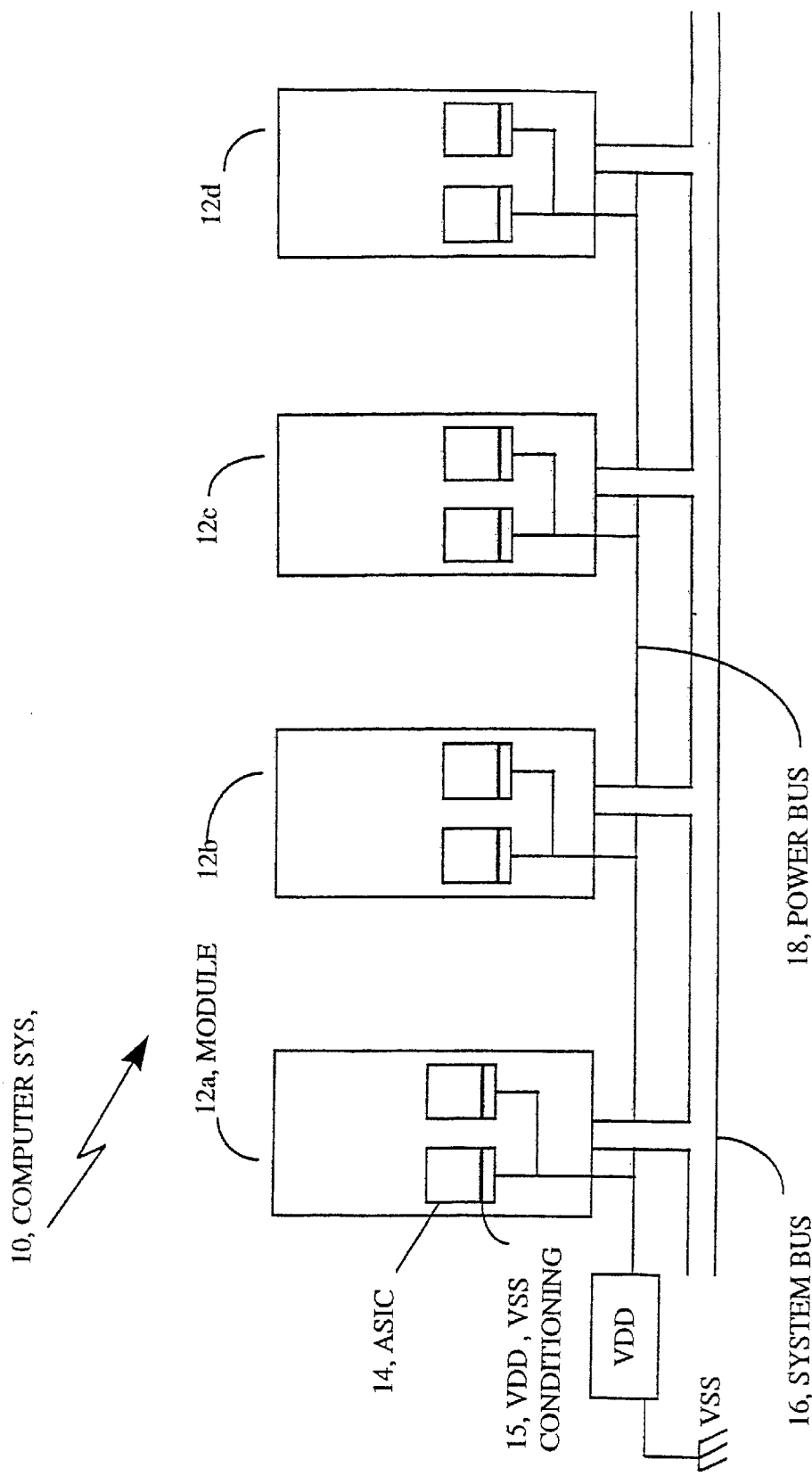
FIG. 1 is a block diagram of a computer system incorporating power conditioning circuits in accordance with the present invention.

Referring now to FIG. 1, a computer system 10 is shown to comprise a plurality of modules 12a–12d. Here modules 12a–12d can be any one of a processor module, memory modules and/or I/O modules as desired. Here each of the modules 12a–12d is shown as including a plurality of application specific integrated circuits (ASIC) 14. The ASICs 14 perform selected circuit functions on the modules 12a–12d. In particular, a portion 15 of the ASICs 14 here comprises power conditioning circuits for VDD, VSS supplies, as will be described. These conditioning circuits are used to condition and couple external power supply connections provided via a power bus 18 from a power supply VDDX to corresponding internal connections (not shown) for power and signal return paths to VSS in the ASICs 14. Although the arrangement will be described as part of the ASICs 14 it should be clear that any integrated circuit can benefit from the arrangement.

The computer system 10 is coupled via a system bus 16. The system bus 16 has a connection (not shown) to the ASICs 14. The ASICs 14 include, amongst other things, bus driver and receiver circuits (not shown) which are used to couple the ASIC 14 and hence the module 12a, as well as modules 12b–12c to the system bus 16. The power supply conditioning circuit 15 is used to condition the output or "external" power provided via supply nodes VDDX and VSSX to the internal supply nodes (not shown).

Figure 2:
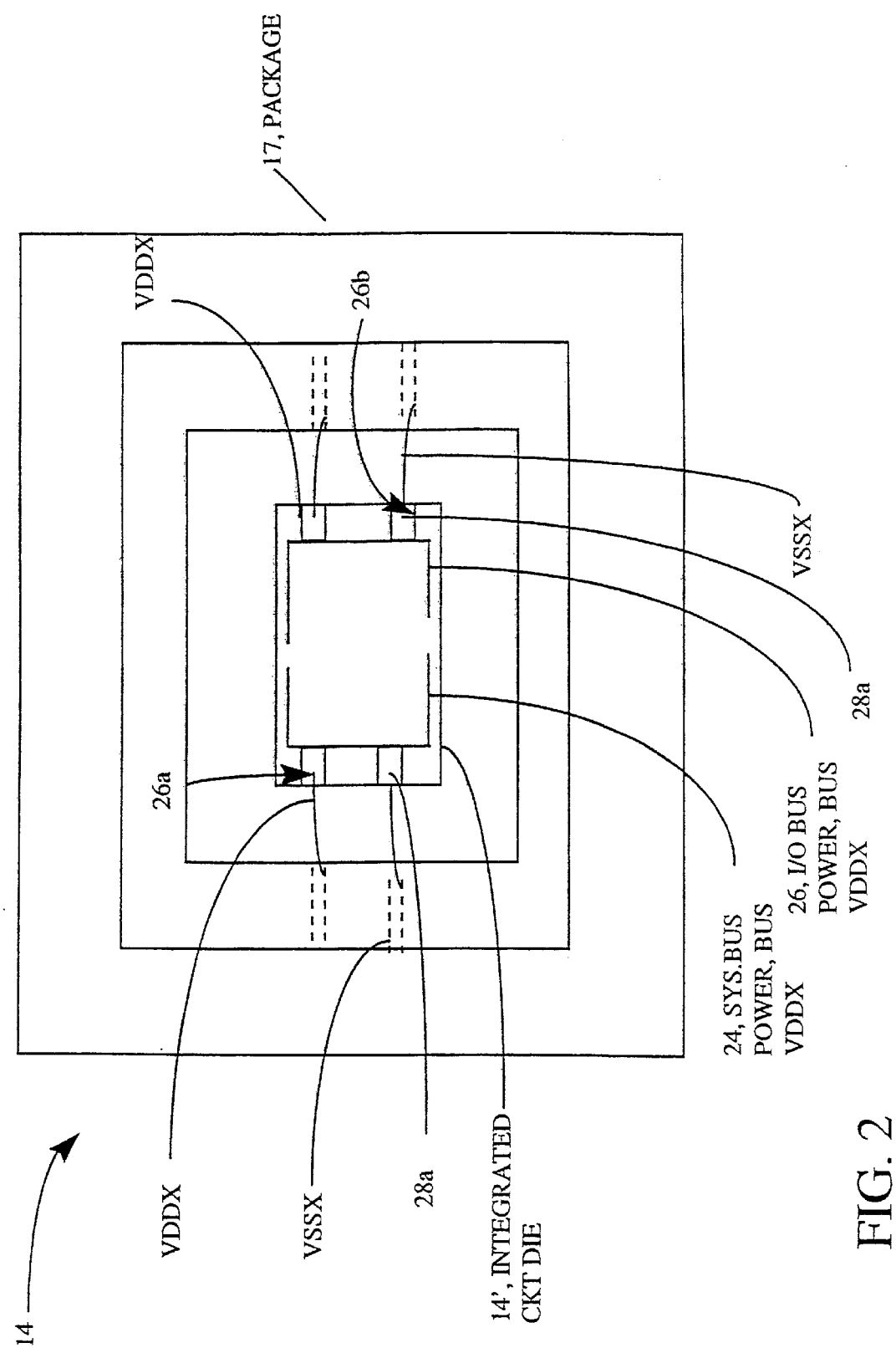
FIG. 2 is a plan view of a typical ASIC package having power supply connections.

Referring now to FIG. 2, a representation of the ASIC 14 disposed in a ASIC package 17 is shown having an integrated circuit die or chip 14' mounted within the package 17. Also shown in FIG. 2 are a plurality of output or "external" supply connections VDDX and VSSX which are made to the integrated circuit 14 via pins and conductors (not numbered). The connections VDDX and VSSX are made to power conditioning circuits 26a, 26b. Also shown diagrammatically on the integrated circuit die 14' are a pair of power supply power buses, one a system bus power bus 24 and the other an I/O bus power bus 26. That is, in this particular ASIC the ASIC is illustratively used to connect a system bus to an I/O bus. Since the I/O bus may be powered by a different power supply than that being used to power the system bus two separate power bus arrangements are used. It is generally not desirable to directly connect the power supply buses together. In FIG. 2 is illustrated the connections for the VDDX supplies for each one of the buses, it being understood that there are corresponding power buses for VSSX for each of the system and I/O buses.

The circuits 26a and 26b and corresponding circuits 28a and 28b are used to couple the internal supply rails 24 and 26 to the external supply voltages VDDX. They are also used to couple the external return rails (not shown) to the external supply VSSX.

Figure 3A:
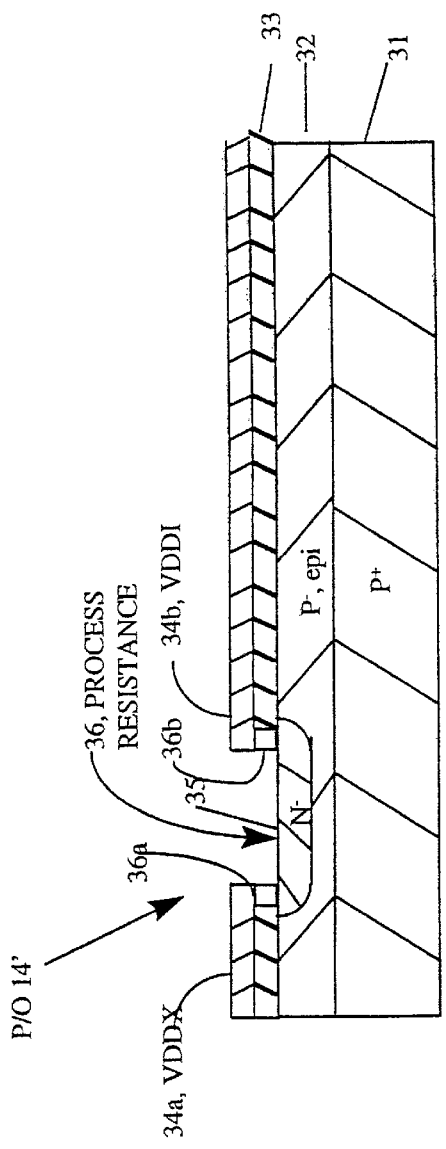
FIGS. 3A and 3B are cross-sectional views of portions of an integrated circuit used in the ASIC of FIG. 2 showing process resistances used to reduce input and output noise on power supply nodes.

Referring now to FIG. 3, one illustrative embodiment of the circuit used to couple the external supply voltage to the internal supply voltage rail is shown. The circuit comprises a process resistance 36 which is formed within an semiconductor layer such as an implanted doped layer or epitaxial layer 32 disposed over a semiconductor substrate 31 used to form the integrated circuit die 14' of FIG. 2. A The process resistance 36 comprises an implanted or otherwise provided N+ doped region 35 in here a P– epitaxial layer. The process resistance 36 is formed by making ohmic contact via slugs 36a and 36b which are here comprised of tungsten or tungsten/titanium and which are used to interconnect the doped region 35 conductors 34a for connection to VDDX the external or output supply voltage connection and conductor 34b which is used to connect to VDD the internal supply voltage bus denoted in FIG. 2 as 24. A similar arrangement is provided for circuit 26b to connect VDDX the external supply voltage to the I/O power bus 26.

Figure 3B:
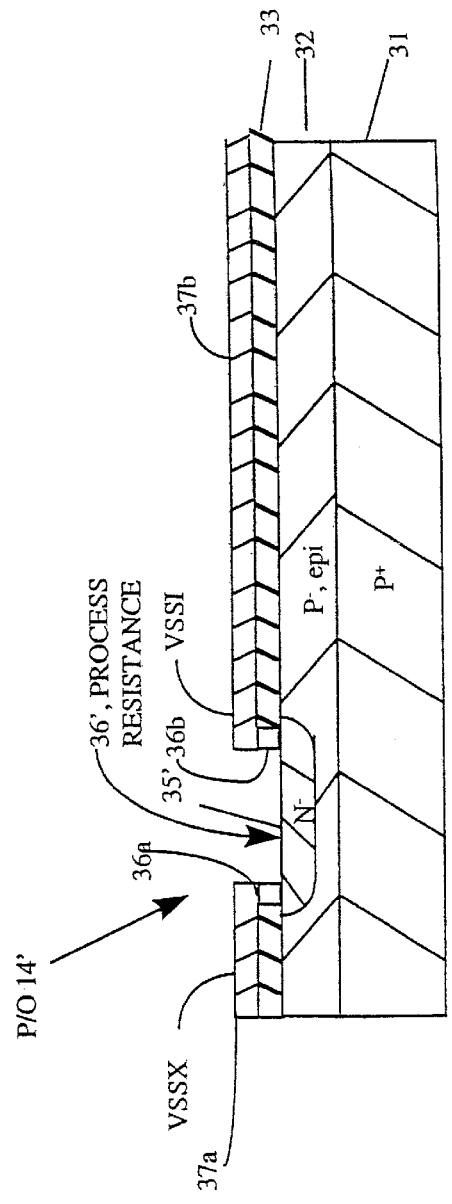

Similar connections are also provided for connecting VSSX to VSS via a metal layer 37 which is patterned to provide conductors 37a and 37b as shown in FIG. 3B. Similarly, a second process resistance 36' is used to couple VSSX to VSS and comprises a pair of contact layers 36a–36b which are again comprised of tungsten/titanium and which are used to couple the conductors 37a–37b to the ends of the resistance formed by a second doped region 35'. Illustratively, both conductive regions 35 and 35' are typically doped to a concentration of $9.0 \times 10^{16}$ atoms/cm, have a length of 2.5 $\mu$m and have a width of 89 $\mu$m to provide an overall resistance of about 79 ohms. In general, the parallel combination of all of the well resistor implemented on the integrated circuit will have a typical resistance is in the range of about 0.01 to about 5 ohms. The preferred parallel resistance of the wells would be in the range of about 0.05 to 5 ohms. The precise value of resistance used for each one of those wells is dependent upon the number of pins used in the package and the capacitance of the die and as is further illustrated in the table below.

TABLE

| Number of package pins (related to die size) | Capacitance of die (related to die size) | Process resistor 36 resistance |
|---|---|---|
| 120 pins | appx. 20,000 pf | 1 ohm min. |
| 120 pins | appx. 10,000 pf | 2 ohms min. |
| 240 pins | appx. 40,000 pf | 0.5 ohms |

The process resistance 36 provides a path or link between the internal power supply lines VDD and VSS and the external power supply lines VDDX and VSSX respectively. This path permits transfer of stored charge to the external lines VDDX and VSSX from the effective capacitance between the VDD and VSS lines in the integrated circuit. This provides a damping resistance to the effective resonant circuits provided from inherent inductances associated with package power supply connections. By reducing the amplitude of noise on the external or output supply nodes VDDX and VSSX conducted and parasitically coupled noise on the signal lines is also reduced.

Figure 4:
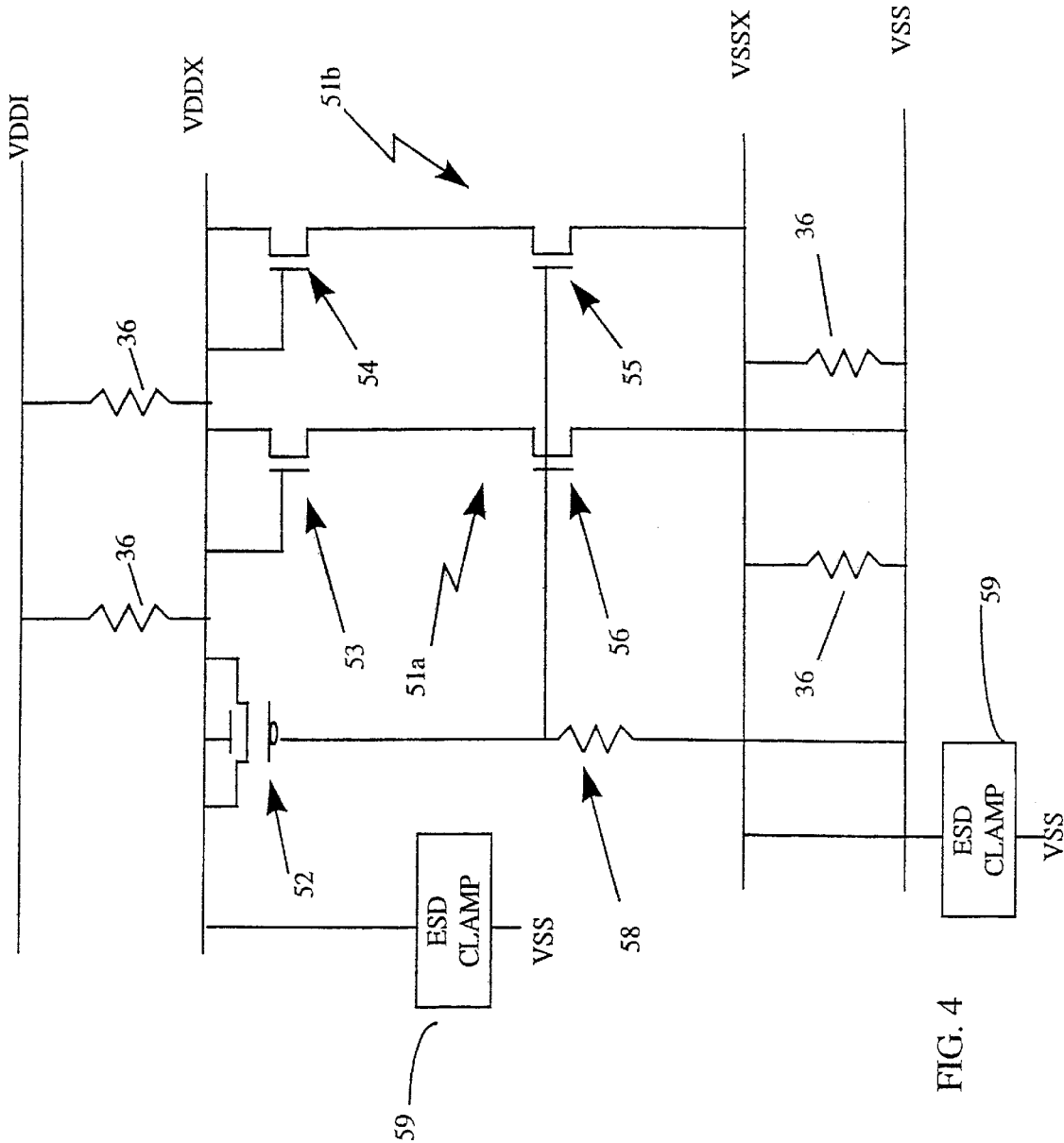
FIG. 4 is a schematic representation of a circuit used to limit voltage excursions on power supply nodes relative to internal and external returns.

Referring now to FIG. 4, a circuit 50 used to clamp voltage excursions between the internal and external power supplies and the internal and external return paths is shown to include the process resistances 36 as generally described in conjunction with FIG. A first one is coupled between VDDX and VDD and a second one is coupled between VSS and VSSX. The circuit also includes a first clamp 51a comprised of transistors 53 and 56 coupled between VDDX and VSS and a second clamp 51b comprised of transistors 54 and 55 coupled between VDDX and VSSX. Transistors 53 and 54 are optionally provided to improve circuit reliability by reducing voltage stress to clamp transistors 55 and 56. The circuit also includes a resistance, here a polysilicide resistance 58 coupled between the connection of gate electrodes of transistors 55 and 56 and the internal reference node VSS. The polysilicide resistance 58 is also coupled to the gate electrode of a third transistor 52. Here transistor 52 is a P-channel transistor used as a capacitor whereas transistors 55 and 56 are N-channel clamping transistors.

The circuit 50 also includes electrostatic discharge circuits 59 which are disposed between VDDX and VSS, and VSSX and VSS as shown. The ESD circuit 49 is used to prevent electrostatic discharge induced voltages from destroying internal portions (not shown) of the circuit 14 (FIG. 2).

The noise clamp circuit 50 operates as follows. The process resistance 58 is disposed to charge the gate of transistor 52 and to insure that the gate of transistors 55 and 56 are at a voltage level such that transistors 55 and 56 draw no current when there is no switching current activity. When the integrated circuit 14 input or output switching activity causes the VDDX node voltage to exceed its quiescent value relative to VSS and or VSSX, transistor 52 translates the majority of the change in voltage to a gate-source voltage at transistors 55 and 56, causing either transistor 55 and/or transistor 56 to draw current and clamp node VDDX voltage excursions relative to nodes VSS and VSSX.

The pair of clamping transistors reduces noise on the VDDX and the VSSX lines by clamping transient voltages between VDDX and VSSX, as well as between VDDX and VSS.

Having described preferred embodiments of the invention, it will now become apparent to those of skill in the art that other embodiments incorporating its concepts may be provided. For example, signficant benefit can be achieved by using the process resistance alone or the clamp circuit alone. It is felt therefore that this invention should not be limited to the disclosed embodiments but rather should be limited only by the spirit and scope of the appended claims.

What is claimed is:

1. A computer system, comprising:

a processor module, connected to a system bus by a first interface circuit;

an I/O module coupled to said system bus by a second interface circuit, for conveying input and output data to said processor module;

a memory module, connected to said system bus by a third interface circuit, for storing data for said processor module; and a power supply conditioning unit, for providing a power supply voltage from an external power supply bus to an internal power supply bus of a predetermined one of said interface circuits and for reducing a magnitude of a voltage transient on said external power supply bus by combining a resistor, coupling said internal and external power supply busses, with a capacitance of said internal power supply bus.

2. The computer system of claim 1, wherein said combination of said resistance of said coupling device and said capacitance of said internal power supply bus transfers a charge stored by said capacitance to said external power supply bus when said magnitude of said voltage transient is different than a magnitude of a voltage on said internal power supply circuit.

3. The computer system of claim 2 wherein said magnitude of said voltage transient is caused by a drawing of a load current from said external power supply circuit, and wherein said transferred charge reduces said magnitude of said voltage transient.

4. The computer system of claim 3 wherein said coupling device includes a first process resistor, said process resistor having a first interconnect coupled to said external power supply circuit and to a first resistive region of said predetermined interface circuit, said first process resistor further including a second interconnect coupled to said internal power supply circuit and to a different portion of said first resistive region.

5. The computer system of claim 4 wherein said coupling device further includes a second process resistor, said process resistor having a third interconnect coupled to an external reference bus associated with said external power supply bus and to a second resistive region of said predetermined interface circuit, said second process resistor further including a fourth interconnect coupled to an internal reference bus associated with said internal power supply bus and to a different portion of said second resistive region of said predetermined interface circuit.

6. The computer system of claim 5 wherein said first and said second resistive region of said predetermined interface circuit are comprised of an N+ doped region disposed within said integrated circuit.

\* \* \* \* \*